United States Patent [19]
Aldrich et al.

[11] 3,935,441
[45] Jan. 27, 1976

[54] APPARATUS FOR MAINTAINING IMAGE DIGITIZATION IN PARALLEL OPTICAL DIGITAL PROCESSING SYSTEMS

[75] Inventors: Ralph E. Aldrich, Acton; Julius Feinleib, Cambridge, both of Mass.

[73] Assignee: Itek Corporation, Lexington, Mass.

[22] Filed: Jan. 2, 1974

[21] Appl. No.: 430,020

[52] U.S. Cl. ........ 250/211 R; 250/568; 340/173 LS; 235/152
[51] Int. Cl.$^2$ ......................................... H01J 39/12
[58] Field of Search ............. 250/213 A, 213 R, 225, 250/566, 568; 350/160 LC, 150; 340/347 DD, 173 LS, 173 LM; 235/152

[56] References Cited
UNITED STATES PATENTS

| | | | |
|---|---|---|---|
| 3,081,402 | 3/1963 | Van Santen | 250/213 R |
| 3,440,620 | 4/1969 | French | 350/160 LC X |
| 3,499,112 | 3/1970 | Heilmeier et al. | 350/160 LC X |
| 3,517,206 | 6/1970 | Oliver | 250/225 |
| 3,700,902 | 10/1972 | Buchan | 250/213 R |
| 3,716,290 | 2/1973 | Borel et al. | 350/160 LC |

OTHER PUBLICATIONS
Hornberger: I. B. M. Technical Disclosure Bulletin; Vol. 12; No. 10; 3/70 pp. 1697, 1698.

*Primary Examiner*—Walter Stolwein
*Attorney, Agent, or Firm*—Homer O. Blair; Robert L. Nathans; Gerald H. Glanzman

[57] ABSTRACT

Apparatus for maintaining image definition and intensity in optical image processing operations. The apparatus comprises an improved photosensitive device responsive to an applied radiation image pattern for establishing internal electric fields each of which are representative of the intensity of different portions of the applied pattern. Associated with the photosensitive device are a plurality of transparent, conductive targets or conductors aligned to receive the different portions of the applied radiation pattern and to establish discrete internal fields in the device which are uniform over the area of each target notwithstanding any non-uniformities that might exist in the intensity distribution of any of the portions of the applied pattern. The apparatus is especially suitable for use in conjunction with parallel optical digital processing systems in which digital data is represented by an array of radiation image bits of differing intensity and is directed through an optical circuit to be processed in a desired manner.

9 Claims, 4 Drawing Figures

APPARATUS FOR MAINTAINING IMAGE DIGITIZATION IN PARALLEL OPTICAL DIGITAL PROCESSING SYSTEMS

BACKGROUND OF THE INVENTION

1. Field of the Invention

The present invention relates generally to improvements in digital optical processing apparatus. More particularly, the present invention relates to apparatus for maintaining image definition and intensity throughout a multiple step parallel optical digital data processing operation.

2. Description of the Prior Art

In commonly assigned U.S. Pat. application Ser. No. 415,584 of Peter Nisenson, filed on Nov. 14, 1973, and entitled PARALLEL DIGITAL DATA PROCESSING SYSTEM, a parallel optical digital processing system is described wherein digital data is directed through an optical circuit and subjected to the standard logical manipulations of ANDing, ORing, shifting and inverting so as to enable the subject matter represented by the digital data to be processed in some desired manner. In an operative embodiment of the system, the digital data is transmitted through the circuit in the form of optical images consisting of two-dimensional arrays of light and dark areas representing binary ones and zeros, respectively. The circuit itself consists of a large number of electro-optic photosensitive storage devices coupled together by means of a variety of standard optical components such as mirrors, lenses and the like and responsive to the image arrays applied to them to establish internal electric fields representative of the intensities of the different bits of the arrays. By proper control over the circuit and the storage devices, one or more image arrays may be directed through the circuit along prescribed paths to enable the desired processing operations to be carried out.

In a typical processing operation, it is frequently necessary to read image arrays into and out of a large number of these storage devices, and, because of the need for these many iterations, some problems have arisen.

Specifically, it has been found that each time an image array is read into and out of a storage device, some degradation in the quality of the image results, and, after a series of iterations have been performed, deterioration can reach a point that errors may arise in the processing operation. This image deterioration is caused by several factors which will be described in some detail hereinafter, but basically it can be attributed to inherent non-uniformities in the intensity distribution of the light beams used to read data into and out of the storage devices, diffraction effects and system noise. The overall effect of these factors are to cause originally square image bits which make up the image array to assume non-uniform Gaussian shapes, to cause adjacent data bits to tend to overlap one another, and generally to reduce the overall intensity of the image. Put another way, in the operation of the processing system, the originally square bits of binary image data gradually lose their digital qualities and become more analog in nature with variations from point to point over the area of the data bit. This is obviously not a desirable condition in a digital system and makes accurate processing more difficult to obtain especially in long and detailed processing applications.

SUMMARY OF THE PREFERRED EMBODIMENT

By the present invention, substantially improved results have been obtained by providing structure which effectively and automatically restores image definition and intensity every time that an image array is read into a storage device. In accordance with a presently preferred embodiment, this is accomplished by modifying the electro-optic photosensitive storage devices employed in the preferred processing system to have a pattern of transparent conductive segments or targets applied to one or both sides of the device to receive the image array. In the presently most preferred embodiment, wherein the device comprises a wafer of $Bi_{12}SiO_{20}$ (Bisox), this pattern may comprise an array of generally square-shaped transparent conductor elements of $In_2O_3$ having a size approximately equal to that of one data bit (e.g., from about $10\mu m$ to about $50\mu m$ on a side) and spaced from one another by a distance of from about $5\mu m$ to about $50\mu m$.

By utilizing this construction, the image deterioration encountered in the processing system is substantially eliminated for the following reasons. Initially, notwithstanding any non-uniformities which may exist in the intensity distribution of the light beam used to read an image data bit into the storage device, the field established within the Bisox wafer to represent the data bit will be caused to spread out uniformly over the area of the associated conductor element and, therefore, automatically reestablish the digital properties of the latent image stored in the device. Furthermore, since the square conductor elements are slightly spaced from one another, the stored field patterns will be maintained somewhat isolated from one another to minimize interference between them. In addition, by providing the conductor array, it becomes possible to illuminate the wafer with a somewhat greater intensity illumination than would otherwise be possible so as to ensure that the intensity of the images can be maintained at a high level at all times notwithstanding any losses that may occur due to system noise or other causes.

A further advantage provided by the above-described system is that it becomes possible to read out a stored bit of data with a single very narrow beam of light directed through the wafer at any point over the area of a particular conductor element. This is possible because the internal field adjacent any particular conductor will be uniform over its entire area, and, therefore, the same information will be obtained irrespective of where on that image conductor readout is performed. In the prior art system wherein a Gaussian field pattern is established, it is necessary to read out a data bit at the center of the appropriate field to get any kind of accuracy because it is only in that area that intensity remains at a substantially high level. This, therefore, requires extremely precise alignment of the readout equipment and careful monitoring of it. This extreme precision is no longer required with the present invention.

In general, with the present invention, structure has been provided whereby an array of initially square radiation image bits will be maintained square throughout multiple step processing operations and, wherein the intensity of the images can be maintained at a maximum level at all times. The conductor array can be applied to the wafer in a relatively simple manner without significantly adding to the cost of the system. Although there will be some loss of resolution due to the fact that the square conductor elements are slightly spaced from one another, this loss is not significant, and, can readily be compensated for, if desired, by employing larger wafers or several wafers mounted together in a matrix. A clearer understanding of the foregoing as well as further features of the invention will be set forth hereinafter in conjunction with the detailed description of the presently most preferred embodiment.

DETAILED DESCRIPTION OF THE PREFERRED EMBODIMENT

Figure 1:
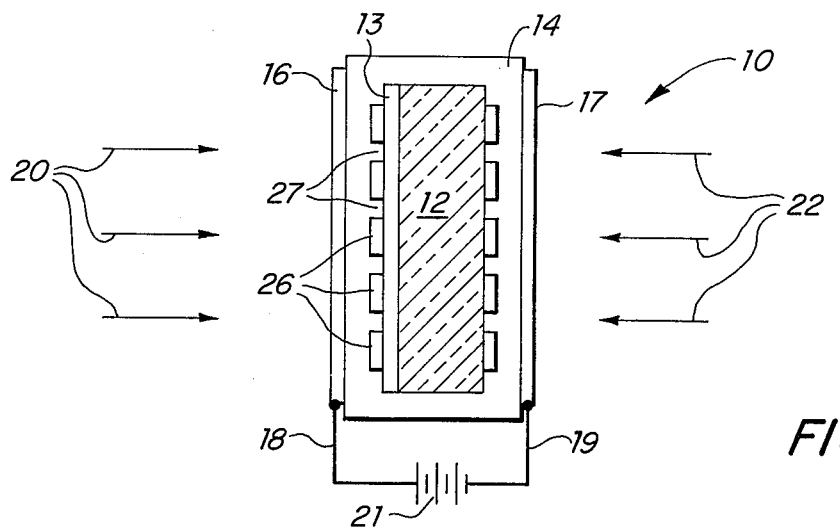
FIG. 1 schematically illustrates an electro-optic photosensitive storage device modified in accordance with a presently preferred embodiment of the invention.

FIG. 1 illustrates in somewhat schematic cross-sectional form an improved electro-optic photosensitive storage device as might be effectively utilized in conjunction with a parallel optical digital data processing system to receive, store and read out an array of digital image data (although it should be understood that it is not intended to limit the invention to this application). In accordance with a preferred embodiment of the invention, the device, generally referred to by reference number 10, includes a wafer 12 which exhibits both the characteristic of photosensitivity and the electro-optic characteristic of induced birefringence. In accordance with the presently most preferred embodiment, for example, wafer 12 comprises a crystal of $Bi_{12}SiO_{20}$ (Bisox), the conductance of which may be varied as a function of the radiation incident upon it and the birefringence of which may be varied as a function of the electric field applied across it. Wafer 12 is contained, together with a dichroic reflector 13, in a parylene insulating layer 14, while transparent electrodes 16 and 17 are coated onto both faces of the insulating layer. Electrical leads 18 and 19 are also provided to couple the electrodes to a battery 21.

The operation and characteristics of the storage device 10 are set out in detail in the above referred to U.S. Pat. application Ser. No. 415,584 to Peter Nisenson as well as in U.S. Pat. No. 3,517,206 to D. S. Oliver and need not be repeated here, and, for the most part, is not essential to a clear understanding of the present invention. For the present invention, suffice it to say that when radiation to which device 10 is sensitive is applied to it as indicated by arrows 20, the photosensitivity of wafer 12 will cause its conductance to vary as a function of the intensity of the incident radiation. When the incident radiation is of relatively high intensity, wafer 12 will become highly conductive and the field across it imposed by electrodes 16 and 17 coupled to battery 21 will decrease substantially. When, on the other hand, the incident radiation is of relatively low intensity the conductance of the wafer will be increased only slightly and the field across it will be decreased only slightly. From this, if the intensity of the incident radiation varies from place to place over the surface of the wafer, the conductance of the wafer will also vary from place to place in like manner as will the electric field across the wafer.

From the above, it should be apparent that if radiation of one intensity is arbitrarily assigned a value of binary 1 and if radiation of a second (or zero) intensity is assigned a value of binary 0, a binary imaging system can be established in which binary data can be optically presented to the device 10 to be stored therein in the form of variations in the internal electric field for later retrieval. In the processing system to which the present invention is primarily directed, this binary system is established by applying to the storage device a two-dimensional image array made up of a large number of discrete radiation image bits of high or low intensity to establish a corresponding electrical field pattern in the wafer 12. This binary image array can be set up in several different ways. For example, by one technique, a transparency can be provided having an array of transparent and substantially opaque areas arranged over its surface. By then illuminating the storage device through the transparency, the desired electrical field distribution can be established in wafer 12. By an alternative technique, a laser or other light beam can be scanned across the surface of device 10 and turned on and off at the appropriate times to establish the same image array. At this point, it should be emphasized that the language "high intensity" and "low intensity" used herein are intended to include high and low exposures as well. For example, substantially identical high intensity images can be established by illuminating the wafer with high intensity radiation for a relatively short period of time or by illuminating the wafer with lower intensity radiation for a relatively longer period of time.

Once the digital data has been effectively stored in the device it can be read out by exposing the device to radiation illustrated by arrows 22. This radiation will pass through the wafer 12, be modulated by the internal electric fields, and reflect back off of dichroic reflector 13 and, after thresholding to distinguish between intensities above and below a specified level will provide a new binary radiation image array representative of the field pattern that was stored in wafer 12. This new radiation image array can then be directed to further storage devices as needed to permit desired processing operations to be carried out as explained in the above-mentioned patent application.

Figure 2A:
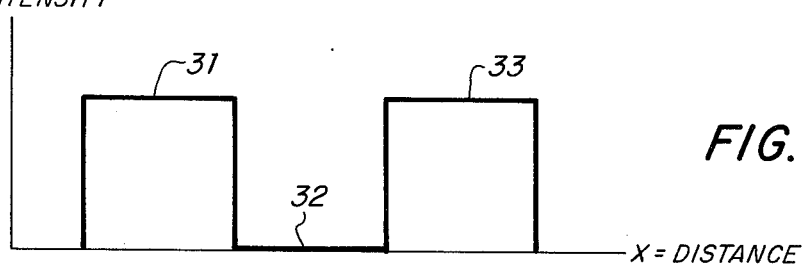
FIGS. 2A, 2B and 2C are provided to graphically illustrate the improved characteristics provided by the present invention.

For a processing system of this type to be of maximum effectiveness, it is evident that the electrical field pattern established in the wafer 12 must retain the discrete digital qualities of the applied radiation image bits and that the radiation image array provided upon readout from the device should accurately reproduce the stored binary information. Unfortunately, however, it has been found that after an image is directed through a series of iterations involving a plurality of storage devices, the discrete digital image bits tend to lose their digital qualities and become analog in nature varying over their area. The causes of these problems can best be understood with reference to FIGS. 2A, B and C. Ideally in a binary system there are two possible states; 1 or 0. In our optical system, a binary 1 is represented by a high intensity radiation image bit of, for example, generally square shape as obtained by shining light through a transparent area on a transparency or by turning a light beam on at the appropriate time as it is scanned across the surface of device 10. A binary 0 is represented by a low intensity area (preferably zero intensity) formed by an opaque area on the transparency or by turning the scanning light beam off at the appropriate time. This ideal condition is illustrated in FIG. 2A which is a graph of intensity versus distance *x* (e.g. length or width of a data bit). In FIG. 2A are shown three adjacent radiation image bits 31, 32 and 33 wherein bits 31 and 33 are of relatively high intensity and represent binary 1 and bit 32 is of substantially zero intensity and represents binary 0. If the radiation images applied to storage device 10 were as precise as illustrated in FIG. 2A, with the intensity of each data bit being uniform across its entire length and over its entire area, the corresponding internal electric fields established within the storage device would be also uniform at all positions.

Figure 2B:
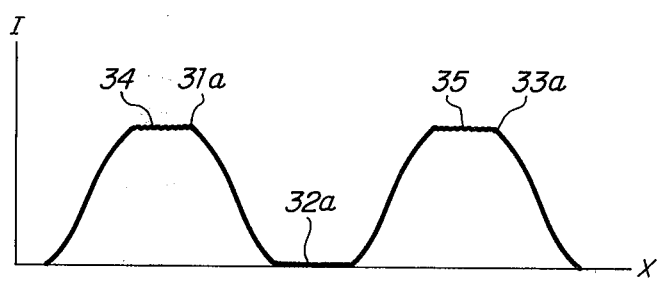

Unfortunately, however, the intensity of each radiation image bit read into the storage device is not so uniform. This is because the intensity distribution across a light beam is, inherently, of Gaussian shape with the maximum intensity being in the center of the beam and with somewhat reduced intensity around the edges of the beam. Furthermore, in addition to this inherent Gaussian intensity distribution in light beams, there are also diffraction effects involved in our imaging operation which become significant because of the extreme smallness of the image bits being processed. Accordingly, instead of applying radiation image bits which are of uniform intensity at all positions over their area, what will be applied to the storage device are radiation image bits whose intensities vary in an irregular manner as illustrated in FIG. 2B. As can be seen, intensities 31*a*, 32*a* and 33*a* are no longer uniform across the length of the data bits but are of somewhat bell shape with maximum intensity at the center of the bit and with reduced intensity around the edges. Furthermore, it can be seen that some overlapping or spreading out of the data bits are present with data bit 31*a* overlapping the area that should be occupied by data bit 32*a* and so forth. Since the intensity distribution of the illuminating radiation is in the form illustrated in FIG. 2B, the electric field pattern established in the wafer 12 will be of similar shape.

Further, as shown in FIG. 2B the maximum intensity 34 and 35 of data bits 31*a* and 33*a*, respectively, are also somewhat less than the ideal maximum intensity shown in FIG. 2A and also somewhat irregular. This is due to inherent noises present within the system caused by material and device non-uniformities. For example, any scratches or other imperfections on the various surfaces of the storage device 10 will cause a certain amount of light to be scattered which will affect the intensity of the image. Also, to some extent, migrating charges within the wafer 12 will become blocked or otherwise become improperly oriented within the wafer. These noise effects will gradually reduce the intensity of the image and introduce localized non-uniformities in all areas of the image.

Figure 2C:
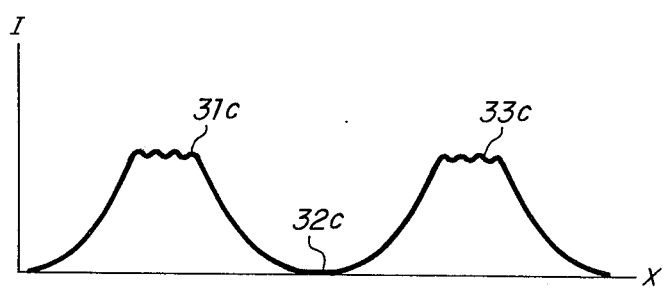

When the degraded image is directed through a whole series of iterations involving reading it into and out of a whole series of storage devices 10, the quality of the image bits will gradually degrade to greater extents as illustrated in FIG. 2C and bits 31*c*, 32*c* and 33*c* will become even more non-uniform and irregular and the discreteness between them will be lessened.

In general, it can be seen from FIGS. 2A, 2B and 2C that the initially discrete digital image bits gradually lose their digital qualities and become analog in nature, varying over their area to a greater and greater extent such that eventually the fields representing a binary one and the fields representing a binary zero become indistinguishable from one another, at least in some portions of the fields, and inaccurate output data can be obtained. This is obviously an undesirable condition.

At this point it should be emphasized that FIGS. 2B and 2C only graphically explain what can happen to the data bits. In operation, all data bits are not necessarily degraded uniformly or by the same amounts. For example, wherein the image array is applied with a single beam illuminated through a transparency, peripheral bits of the array will be degraded to a greater extent than centrally located bits. Also, high intensity bits will degrade to a greater extent than low or substantially zero intensity bits. In general, however, the effects of the Gaussian intensity distribution, diffraction, and noise will affect the image and become significant after a series of iterations.

The present invention provides structure which is effective in obviating these problems by automatically redefining or redigitizing the radiation bits of the image array every time that it is read into a storage device. The structure is illustrated in FIG. 1, and comprises an array of generally square shaped highly conductive transparent conductor elements or targets 26 which is preferably applied to both sides of the wafer as shown but may be applied to only one side if desired. Specifically, each of these conductor squares are designed to be approximately equal in size to one radiation image bit from about 10$\mu$m to about 50$\mu$m, e.g., on a side (although exact precision is not essential) and are spaced from one another by a slight distance 27, e.g. from about 5$\mu$m to about 50$\mu$m. The conductor elements are arranged in an array similar to that of the radiation image array (e.g., two-dimensional) so that each square will correspond to and be a target for an image bit. If the image bits are of other than square shape, for example, hexagonal or triangular, the conductors will be of corresponding shape.

By including these square conductor elements in the storage device 10, the above-described problems are substantially avoided. Specifically, when the device is illuminated with an image array, each radiation image bit will pass through its associated conductor element and modify the internal electric field of the wafer adjacent that conductor element as a function of the intensity of the radiation. Since, however, the conductor elements are very highly conductive, charges will automatically spread out uniformly over the area of the conductor to make the internal electric field representing each radiation image bit uniform throughout its area. This will happen notwithstanding any non-uniformities in the intensity distribution of the applied radiation image bit which might exist.

Furthermore, since the plurality of conductor squares are spaced from another by a slight amount, the internal fields within the wafer will be effectively isolated from one another so that charges will not be able to spread, to any extent, to adjacent conductors. Any charges that do spread out, in any event, will not cause any serious problems because they will also spread out over the area of the adjacent conductors, and, therefore, only have a minor effect on the intensity of adjacent fields and, in any event, not affect their uniformity. Also, since in reading out the array, thresholding between intensity levels is performed for rebinarization of the image array as explained in the referred to patent application, these minor intensity variations will be cancelled out in the readout process and will not be sufficient to affect the accuracy of the readout.

Because the internal field associated with a particular data bit is uniform over its entire area, it becomes possible to read out the data it represents at any point over its area. In the system described previously, for readout it was necessary to illuminate a data bit with readout light adjacent the center of the field where the intensity was at least relatively accurate. In the present invention, since the field is uniform, throughout, the data can be read out anywhere over the area of the field and the same information will be obtained. This means that the readout equipment need not be as precisely aligned as before. Also, the chances of the readout being rendered inaccurate by stray charges are minimized.

In the presently preferred embodiment of the invention the conductor element 26 preferably comprise squares of $In_2O_3$ since it is highly transparent, conductive ($<10^6$ohms/square) and matches the refractive index of the Bisox wafer very well. If desired, however, other materials such as indium tin oxide or tin oxide could also be used. The $In_2O_3$ squares can be applied by several well known techniques but the preferred manner is by conventional photoresist techniques. For example, it can be applied by depositing a uniform $In_2O_3$ layer onto the $Bi_{12}SiO_{20}$ wafer, or onto the dichroic reflector, (by sputtering, for example), coating that layer with a suitable photopolymer layer and finally, by conventional photoresist techniques removing portions of the $In_2O_3$ layer to establish the square. The conductor squares may be, for example, $10^{-5}$ cm thick to provide a sheet conductance of less than $10^6$ ohms per square conductor element.

Preferably the square conductor array is applied to both sides of the $Bi_{12}SiO_{20}$ wafer so as to make the device reversible, although this is not essential and only one side need be coated if desired.

To read out the data stored within the wafer, a mask similar to the conductor array can be constructed so that a plurality of readout light beams aligned with each of the conductor squares can be provided. As mentioned previously, extreme accuracy is not required because each beam can read out the data at any position over the area of the conductor square.

A further advantage provided by the present invention is that it becomes possible to illuminate the storage device with somewhat higher intensity radiation or for a longer period of time than is possible in the prior art system without danger of over-exposure. Accordingly, it becomes possible to overcome the gradual reduction in image intensity due to system noise or other causes so that the images may be maintained at a maximum intensity throughout the processing operation. An increase in the intensity of about 10% is adequate for this purpose.

In conclusion, therefore, what has been provided is an improved storage device construction that automatically maintains the digitization of a radiation image array notwithstanding any non-uniformities in the intensity of the light beams employed in the system. The invention permits accuracies to be maintained throughout a long and detailed processing operation. Although there is a slight loss in resolution due to the fact that the conductor squares are spaced from one another by a slight amount, this loss is more than compensated for by the increased accuracy and, in any event, can be minimized by using larger wafers or a plurality of wafers mounted together.

Although what has been described is a presently preferred embodiment of the invention, it should be recognized that the invention may take other forms and various additions, omissions and modifications can be made without departing from the spirit of the invention. It should be understood, therefore, that the invention should be limited only as required by the scope of the following claims.

What is claimed is:

1. In an imaging apparatus including a photosensitive device responsive to applied radiation for establishing internal electric fields representative of the intensity of different portions of said applied radiation; the improvement comprising:
   a two-dimensional array of radiation transmissive electrically conductive targets associated with said device, each of said targets in said array being electrically isolated from one another and being aligned to receive a different one of said portions of said applied radiation for establishing a plurality of discrete internal electric fields, each of which are representative of the intensity of one of said radiation portions, and each of which are substantially uniform over the area of the targets due to the high conductivity thereof notwithstanding any non-uniformities that might exist in the intensity distribution of any of said radiation portions.

2. Apparatus as recited in claim 1 wherein each of said targets in said array are spaced from one another.

3. Apparatus as recited in claim 2 wherein said two-dimensional arrays of targets are applied to at least one face of said device.

4. Apparatus as recited in claim 3 wherein two-dimensional arrays of targets are applied to two opposed faces of said device.

5. Apparatus as recited in claim 3 wherein said targets are of a substantially square shape.

6. Apparatus as recited in claim 5 wherein said photosensitive device comprises a wafer of $Bi_{12}SiO_{20}$.

7. Apparatus as recited in claim 5 wherein said targets are from about 10$\mu$m to about 50$\mu$m in length.

8. Apparatus as recited in claim 3 wherein said targets are spaced from one another by a distance of about 5$\mu$m to about 50$\mu$m.

9. Apparatus as recited in claim 3 wherein said targets comprise elements of $In_2O_3$.

* * * * *